US012572713B2

(12) United States Patent
Wang et al.

(10) Patent No.:  US 12,572,713 B2
(45) Date of Patent:      Mar. 10, 2026

(54) TECHNIQUES FOR EXTRACTION FROM VEHICLE DRIVING LOG FILES TO SIMULATION SCENARIOS

(71) Applicants: Zijian Wang, Troy, MI (US); Hao Wu, Rochester Hills, MI (US); Emilio Moyers Barrera, Bloomfield Hills, MI (US)

(72) Inventors: Zijian Wang, Troy, MI (US); Hao Wu, Rochester Hills, MI (US); Emilio Moyers Barrera, Bloomfield Hills, MI (US)

(73) Assignee: FCA US LLC, Auburn Hills, MI (US)

( * ) Notice: Subject to any disclaimer, the term of this patent is extended or adjusted under 35 U.S.C. 154(b) by 1080 days.

(21) Appl. No.: 17/585,986

(22) Filed: Jan. 27, 2022

(65) Prior Publication Data

US 2023/0237212 A1      Jul. 27, 2023

(51) Int. Cl.
G06F 30/20          (2020.01)
G07C 5/00           (2006.01)
B60W 60/00          (2020.01)

(52) U.S. Cl.
CPC ............. G06F 30/20 (2020.01); G07C 5/008 (2013.01); B60W 60/001 (2020.02); B60W 2554/20 (2020.02); B60W 2554/40 (2020.02); B60W 2555/60 (2020.02)

(58) Field of Classification Search
CPC ......... G06F 30/20; G06F 30/15; G07C 5/008; B60W 60/001; B60W 2554/20; B60W 2554/40; B60W 2555/60
See application file for complete search history.

(56) References Cited

U.S. PATENT DOCUMENTS

| 8,396,611 | B2 | 3/2013 | Phillips et al. | |
| 10,635,761 | B2 | 4/2020 | English et al. | |
| 11,814,059 | B1 * | 11/2023 | Reschka | B60W 40/09 |
| 2021/0347372 | A1 * | 11/2021 | Bagschik | G06V 20/56 |
| 2022/0245109 | A1 * | 8/2022 | Hatami-Hanza | G06N 7/01 |
| 2022/0266859 | A1 * | 8/2022 | Semple | G06N 20/00 |

OTHER PUBLICATIONS

Park C, Chung S, Lee H. Vehicle-in-the-loop in global coordinates for advanced driver assistance system. Applied Sciences. Apr. 11, 2020;10(8):2645. (Year: 2020).*

* cited by examiner

*Primary Examiner* — Chuen-Meei Gan
(74) *Attorney, Agent, or Firm* — Jeremy J. Klobucar

(57) ABSTRACT

Vehicle advanced driver assistance (ADAS) and autonomous driving feature simulation and verification systems and method receive a driving log file and map data corresponding to an on-road driving scenario by a vehicle and overlay the driving log file and the map data to generate combined data that localizes a position of the vehicle. A whitelist comprising a set of included objects for an ADAS/autonomous driving feature simulation and (ii) a blacklist comprising a set of excluded objects for the ADAS/autonomous driving feature simulation and a template for the ADAS/autonomous driving feature simulation are then obtained. Finally, an ADAS/autonomous driving feature simulation scenario is generated in a desired format using the white and blacklists and the template and executed using a corresponding simulation tool and a result of the executed simulation of the ADAS/autonomous driving feature simulation scenario is verified.

20 Claims, 3 Drawing Sheets

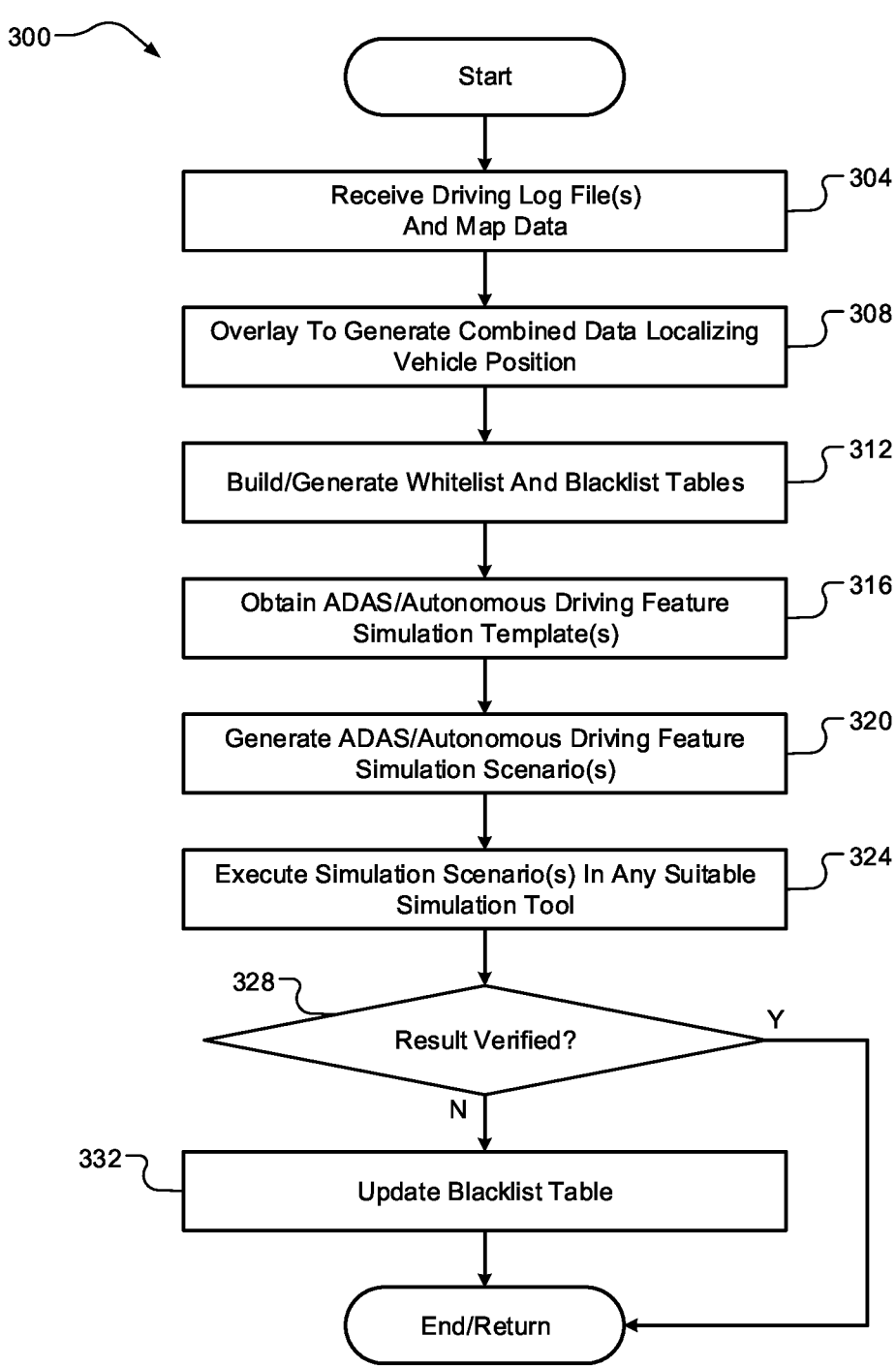

300

Start

Receive Driving Log File(s)
And Map Data                                              304

Overlay To Generate Combined Data Localizing
Vehicle Position                                         308

Build/Generate Whitelist And Blacklist Tables            312

Obtain ADAS/Autonomous Driving Feature
Simulation Template(s)                                   316

Generate ADAS/Autonomous Driving Feature
Simulation Scenario(s)                                   320

Execute Simulation Scenario(s) In Any Suitable
Simulation Tool                                          324

328   Result Verified?   Y

N

332   Update Blacklist Table

End/Return

FIG. 3

TECHNIQUES FOR EXTRACTION FROM VEHICLE DRIVING LOG FILES TO SIMULATION SCENARIOS

FIELD

The present application generally relates to advanced driver assistance (ADAS) and autonomous driving and, more particularly, to techniques for extraction from vehicle driving log files to simulation scenarios for ADAS and autonomous driving features.

BACKGROUND

Both on-road vehicle driving tests and virtual simulation tests are essential to developing advanced driver assistance (ADAS) and autonomous driving technology. During on-road vehicle driving, a large amount of data, in varying formats, is typically gathered and stored as driving log files. There currently is not an easy way to take the data from these driving log files and input it into virtual simulation tests. Conventional simulation tools are limited to only small periods (e.g., 10-20 seconds) of data in driving log files and the extracted scenario files may also not be used in general (e.g., open-source) simulation tools. Further, this conventional process of extraction can result in extracted scenarios that cannot be used in virtual simulations (e.g., moving objects near the host vehicle are missed without any reason). Accordingly, while such conventional simulation tools do work for their intended purpose, there exists an opportunity for improvement in the relevant art.

SUMMARY

According to one example aspect of the invention, a vehicle advanced driver assistance (ADAS) or autonomous driving feature simulation and verification system is presented. In one exemplary implementation, the system comprises a set of sensors configured to generate a driving log file and map data corresponding to an on-road driving scenario by a vehicle and a computing device comprising one or more processors and configured to receive the driving log file and the map data, overlay the driving log file and the map data to generate combined data that localizes a position of the vehicle, using the combined data, obtain (i) a whitelist comprising a set of included objects for an ADAS/autonomous driving feature simulation and (ii) a blacklist comprising a set of excluded objects for the ADAS/autonomous driving feature simulation, obtain a template for the ADAS/autonomous driving feature simulation, generate an ADAS/autonomous driving feature simulation scenario in a desired format using the white and blacklists and the template, execute a simulation of the ADAS/autonomous driving feature simulation scenario in the desired format using a corresponding simulation tool, and verify a result of the executed simulation of the ADAS/autonomous driving feature simulation scenario.

In some implementations, the computing device is further configured to update the blacklist when the executed simulation of the ADAS/autonomous driving scenario is not verified. In some implementations, the driving log file is based on the World Geodetic System 1984 (WSG84) global positioning satellite (GPS) coordinate standard. In some implementations, the driving log file comprises a set of objects including at least one of (i) the vehicle, (ii) another traffic vehicle, (iii) a current route of the vehicle, (iv) a road speed limit, and (iv) a landmark, and respective WSG84

GPS coordinates of each object of the set of objects. In some implementations, the driving log file comprises a set of objects including (i) the vehicle, (ii) another traffic vehicle, (iii) a current route of the vehicle, (iv) a road speed limit, and (iv) a landmark, and respective WSG84 GPS coordinates of each object of the set of objects.

In some implementations, the simulation tool is any virtual ADAS/autonomous driving simulation tool compatible with the WSG84 GPS coordinate standard. In some implementations, the driving log file and the on-road driving scenario do not have a limited duration. In some implementations, the template is obtained from a database comprising a plurality of predefined templates. In some implementations, each of the plurality of predefined templates is one or more comma separated value (CSV) files. In some implementations, the desired format for the ADAS/autonomous driving feature simulation scenario is JavaScript Object Notation (JSON).

According to another example aspect of the invention, a simulation and verification method for an ADAS or autonomous driving feature of a vehicle is presented. In one exemplary implementation, the method comprises receiving, by a computing device comprising one or more processors and from a controller of the vehicle, a driving log file and map data corresponding to an on-road driving scenario by the vehicle captured by a set of sensors of the vehicle, overlaying, by the computing device, the driving log file and the map data to generate combined data that localizes a position of the vehicle, using, by the computing device, the combined data, obtain (i) a whitelist comprising a set of included objects for an ADAS/autonomous driving feature simulation and (ii) a blacklist comprising a set of excluded objects for the ADAS/autonomous driving feature simulation, obtaining, by the computing device, a template for the ADAS/autonomous driving feature simulation, generating, by the computing device, an ADAS/autonomous driving feature simulation scenario in a desired format using the white and blacklists and the template, executing, by the computing device, a simulation of the ADAS/autonomous driving feature simulation scenario in the desired format using a corresponding simulation tool, and verifying, by the computing device, a result of the executed simulation of the ADAS/autonomous driving feature simulation scenario.

In some implementations, the method further comprises updating, by the computing device, the blacklist when the executed simulation of the ADAS/autonomous driving scenario is not verified. In some implementations, the driving log file is based on the WSG84 GPS coordinate standard. In some implementations, the driving log file comprises a set of objects including at least one of (i) the vehicle, (ii) another traffic vehicle, (iii) a current route of the vehicle, (iv) a road speed limit, and (iv) a landmark, and respective WSG84 GPS coordinates of each object of the set of objects. In some implementations, the driving log file comprises a set of objects including (i) the vehicle, (ii) another traffic vehicle, (iii) a current route of the vehicle, (iv) a road speed limit, and (iv) a landmark, and respective WSG84 GPS coordinates of each object of the set of objects.

In some implementations, the simulation tool is any virtual ADAS/autonomous driving simulation tool compatible with the WSG84 GPS coordinate standard. In some implementations, the driving log file and the on-road driving scenario do not have a limited duration. In some implementations, the template is obtained from a database comprising a plurality of predefined templates. In some implementations, each of the plurality of predefined templates is one or more CSV files. In some implementations, the desired format for the ADAS/autonomous driving feature simulation scenario is JSON.

Further areas of applicability of the teachings of the present application will become apparent from the detailed description, claims and the drawings provided hereinafter, wherein like reference numerals refer to like features throughout the several views of the drawings. It should be understood that the detailed description, including disclosed embodiments and drawings referenced therein, are merely exemplary in nature intended for purposes of illustration only and are not intended to limit the scope of the present disclosure, its application or uses. Thus, variations that do not depart from the gist of the present application are intended to be within the scope of the present application.

BRIEF DESCRIPTION OF THE DRAWINGS

FIG. 3 is a flow diagram of an example ADAS/autonomous driving feature simulation and verification method for a vehicle according to the principles of the present application.

DESCRIPTION

As previously discussed, there exists an opportunity for improvement in the art of advanced driver assistance (ADAS) and autonomous driving feature simulation and verification tools. Accordingly, techniques for bridging the gap between driving log files generated during on-road vehicle driving tests and virtual simulation software. The driving log files utilize the World Geodetic System 1984 (WSG84) global positioning satellite (GPS) coordinate standard (global positioning satellite (GPS) coordinate standard such that it is recognizable to a much larger number of virtual simulation software tools. This allows for an extracted scenario to have as long of a duration as desired. Object locations, routes, and velocities are built upon this and sensor data, which allows for easy updating and very accurate and robust behavior simulation. Templates, whitelists, and blacklists are also maintained and updated based on feedback to further improve and optimize the final extracted scenario file for virtual simulation usage. One non-limiting example of the ADAS/autonomous driving features include object detection and tracking, such as for collision avoidance. Each of the above-mentioned template(s), for example, could be associated with a different type of ADAS/autonomous driving feature.

Figure 1:
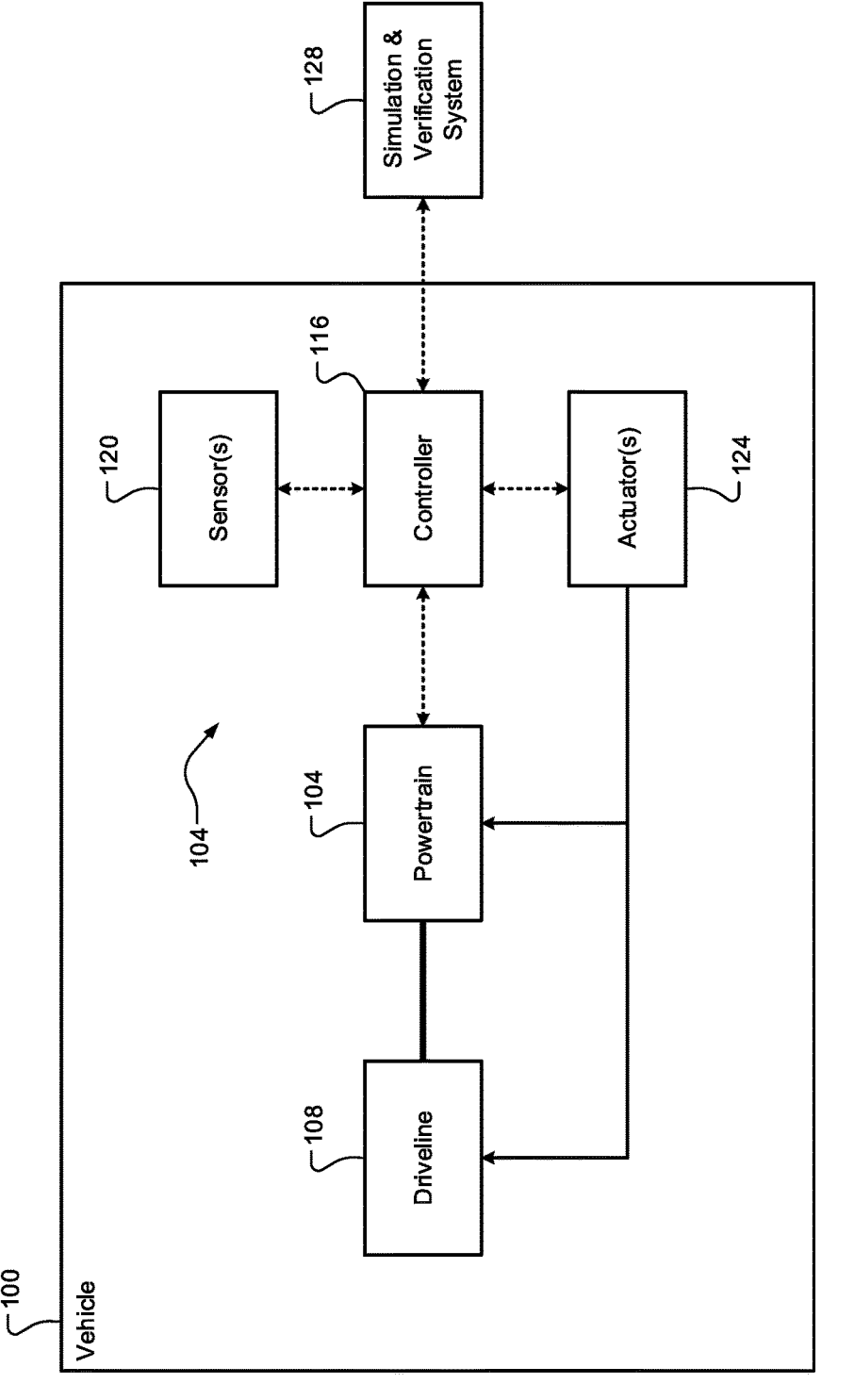
FIG. 1 is a functional block diagram of a vehicle having an example advanced driver assistance (ADAS)/autonomous driving system according to the principles of the present application.

Referring now to FIG. 1, a functional block diagram of a vehicle 100 having an example ADAS/autonomous driving system 104 according to the principles of the present application is illustrated. The vehicle 100 generally comprises a powertrain 108 configured to generate and transfer drive torque to a driveline 112 for vehicle propulsion. The ADAS/autonomous driving system 104 generally comprises a controller 116 of the vehicle 100 that is configured to control operation of the vehicle 100 as well as execute at least one ADAS/autonomous driving feature. The ADAS/autonomous driving system 104 also generally comprises a set of sensors 120 configured to capture/measure data and a set of actuators 124 configured to control driving/operation of the vehicle 100 as part of the at least one ADAS/autonomous driving feature.

The controller 116 can also include a memory (not shown), such as a non-volatile memory (NVM) configured to store driving log files. A simulation and verification system 128 (e.g., a computing system comprising a non-transitory memory storing a set of executable instructions) is in communication with the vehicle 100 (e.g., the controller 116) and is configured to extract the driving log file(s) and perform simulation and verification of the at least one ADAS/autonomous driving feature. While shown as separate from the vehicle 100, it will be appreciated that the system 128 could alternatively be at least partially or fully implemented within the vehicle 100.

Figure 2:
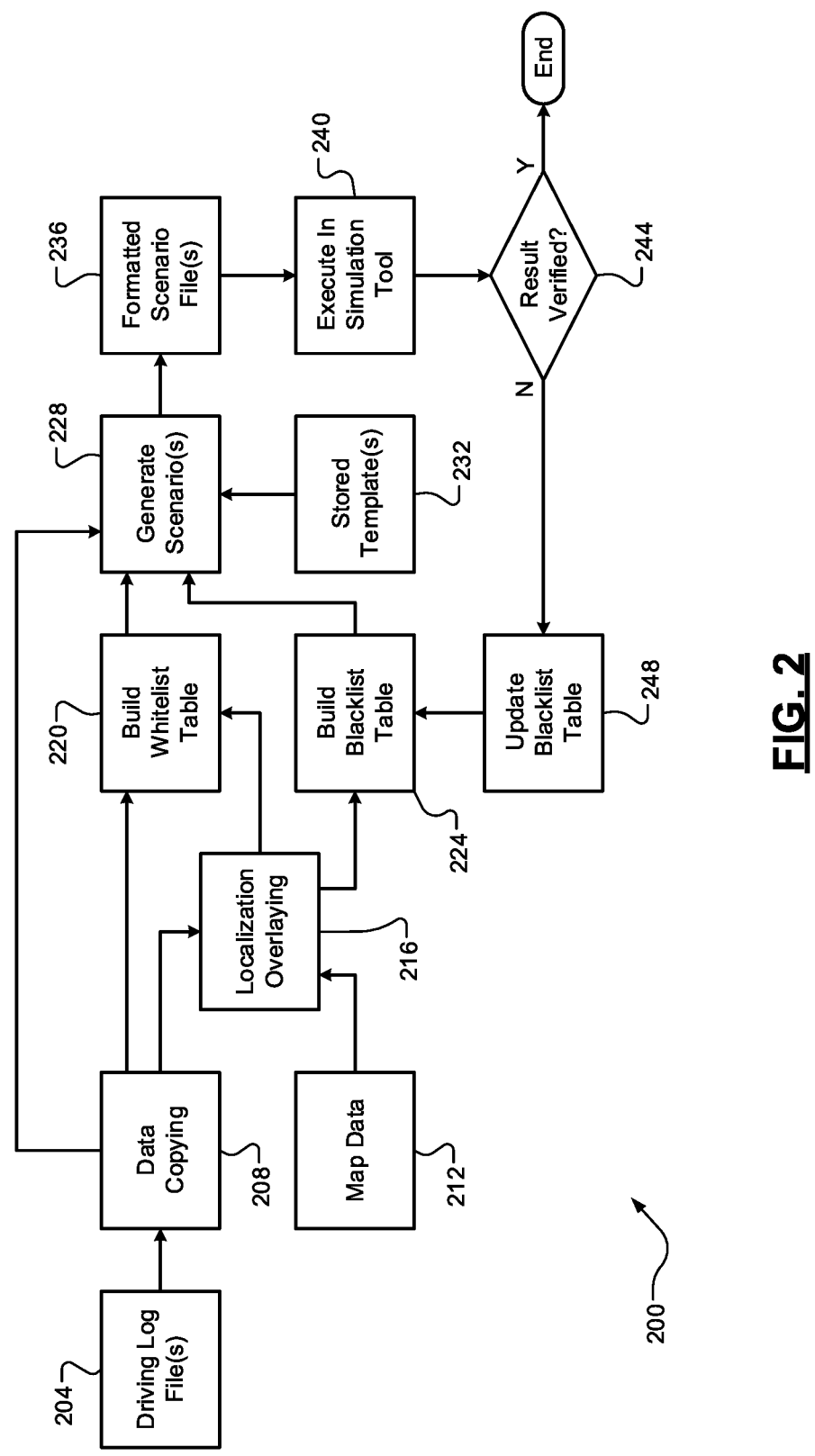
FIG. 2 is a diagram of an example driving log file extraction and ADAS/autonomous driving feature simulation and verification architecture according to the principles of the present application.

Referring now to FIG. 2, a diagram of an example driving log file extraction and ADAS/autonomous driving feature simulation and verification architecture 200 according to the principles of the present application is presented. This architecture 200, for example, could be executable by the simulation and verification system 128 of FIG. 1. At block 204, the driving log file(s) are obtained (e.g., from the controller 116 or an associated memory). As previously discussed, the driving log file(s) are based on the WSG84 GPS coordinate standard. The driving log file(s) can comprise a set of objects including at least one of (i) the vehicle 100, (ii) another traffic vehicle, (iii) a current route of the vehicle 100, (iv) a road speed limit, and (iv) a landmark, and respective WSG84 GPS coordinates of each object of the set of objects.

At block 208, data copying is performed to create a plurality of copies of the driving log file(s). At block 212, map data (e.g., high definition (HD) map data) is obtained from the controller 116 or the sensor(s) 124. The sensor and map data corresponds to an on-road driving scenario by the vehicle 100. The driving log file and the on-road driving scenario also do not have a limited duration (e.g., not limited to 10-20 seconds). At block 216, combined data is generated by overlaying the driving log file(s) and the map data to localize the vehicle's position relative thereto. At block 220, the whitelist table is built or generated and at block 224 the blacklist table is built or generated. This could include, for example only, starting with a previously defined or stored whitelist/blacklist, which could also be updated periodically over time.

At block 228, simulation scenario(s) are generated using the whitelist/blacklist tables and predefined or stored template(s) from block 232 (e.g., comma separated value, or CSV files). At block 236, the scenario file(s) (e.g., CSV files) are formatted in a desired format. In one exemplary implementation, the desired format is JavaScript Object Notation (JSON). At block 240, the formatted simulation scenario(s) are deployed or executed in any suitable simulation tool (e.g., simulation software executing on the simulation and verification system 128). As previously discussed, this simulation tool is compatible with the WSG84 GPS coordinate standard.

At block 244, it is determined whether the result of the executed simulation scenario(s) for the ADAS/autonomous driving feature are verified. When true (verified), the process ends because the simulation was a success. This could include, for example only, verifying the operation of the ADAS/autonomous driving feature such that it can be launched in a production version of the vehicle 100 (e.g., after a plurality of successful scenario verifications). When false (not verified), however, the blacklist table is updated at block 248, and the process can continue/repeat until the simulation scenario(s) have verified results.

Referring now to FIG. 3, a flow diagram of an example simulation and verification method 300 for an ADAS/autonomous driving feature of a vehicle according to the principles of the present application is presented. While the simulation and verification system 128 and the components of vehicle 100 are specifically referenced herein, it will be appreciated that the method 300 could be applicable to any suitable system or vehicle. At 304, the system 128 receives a driving log file and map data corresponding to an on-road driving scenario by the vehicle 100. At 308, the system 128 overlays the driving log file and the map data to generate combined data that localizes a position of the vehicle 100. At 312, the system 128 (e.g., using the combined data) builds/generates (i) a whitelist comprising a set of included objects for an ADAS/autonomous driving feature simulation and (ii) a blacklist comprising a set of excluded objects for the ADAS/autonomous driving feature simulation.

At 316, the system 128 obtains a template for the ADAS/autonomous driving feature simulation. At 320, the system 128 generates ADAS/autonomous driving feature simulation scenario in a desired format (e.g., JSON) using the white and blacklists and the template. At 324, the system 128 deploys or executes a simulation of the ADAS/autonomous driving feature simulation scenario in the desired format using a corresponding simulation tool (e.g., WSG84 GPS compatible). At 328, the system 128 determines whether a result of the executed simulation of the ADAS/autonomous driving feature simulation scenario is verified. When true, the method 300 ends or returns to 304 for another cycle. When false, the method 300 proceeds to 334 where the blacklist table is updated accordingly and the method 300 then ends or returns for another cycle (e.g., using the updated blacklist table).

It will be appreciated that the term "controller" as used herein refers to any suitable control device or set of multiple control devices that is/are configured to perform at least a portion of the techniques of the present application. Non-limiting examples include an application-specific integrated circuit (ASIC), one or more processors and a non-transitory memory having instructions stored thereon that, when executed by the one or more processors, cause the controller to perform a set of operations corresponding to at least a portion of the techniques of the present application. The one or more processors could be either a single processor or two or more processors operating in a parallel or distributed architecture.

It should also be understood that the mixing and matching of features, elements, methodologies and/or functions between various examples may be expressly contemplated herein so that one skilled in the art would appreciate from the present teachings that features, elements and/or functions of one example may be incorporated into another example as appropriate, unless described otherwise above.

What is claimed is:

1. A vehicle advanced driver assistance (ADAS) or autonomous driving feature simulation and verification system, the system comprising:

a set of sensors configured to generate a driving log file and map data corresponding to an on-road driving scenario by a vehicle;

a computing device comprising one or more processors and configured to:

receive the driving log file and the map data;

overlay the driving log file and the map data to generate combined data that localizes a position of the vehicle;

using the combined data, obtain (i) a whitelist comprising a set of included objects for an ADAS/autonomous driving feature simulation and (ii) a blacklist comprising a set of excluded objects for the ADAS/autonomous driving feature simulation;

obtain a template for the ADAS/autonomous driving feature simulation, wherein the template defines a desired file format for an ADAS/autonomous driving feature simulation scenario;

generate the ADAS/autonomous driving feature simulation scenario in the desired file format using the white and blacklists and the template;

execute a simulation of the ADAS/autonomous driving feature simulation scenario using a simulation tool that is designed to process the desired file format to obtain a result;

evaluate the result of the executed simulation of the ADAS/autonomous driving feature simulation scenario;

update the ADAS/autonomous driving feature based on the evaluating to obtain a final ADAS/autonomous driving feature; and upload, to a controller of the vehicle, the final ADAS/autonomous driving feature to the vehicle; and the controller of the vehicle is configured to execute the final ADAS/autonomous driving feature during operation of the vehicle.

2. The system of claim 1, wherein the computing device is further configured to update the blacklist when the result of the executed simulation of the ADAS/autonomous driving simulation scenario is not verified by the evaluating.

3. The system of claim 1, wherein the driving log file is based on the World Geodetic System 1984 (WSG84) global positioning satellite (GPS) coordinate standard.

4. The system of claim 3, wherein the driving log file comprises a set of objects including at least one of (i) the vehicle, (ii) another traffic vehicle, (iii) a current route of the vehicle, (iv) a road speed limit, and (iv) a landmark, and respective WSG84 GPS coordinates of each object of the set of objects.

5. The system of claim 3, wherein the driving log file comprises a set of objects including (i) the vehicle, (ii) another traffic vehicle, (iii) a current route of the vehicle, (iv) a road speed limit, and (iv) a landmark, and respective WSG84 GPS coordinates of each object of the set of objects.

6. The system of claim 3, wherein the simulation tool is any virtual ADAS/autonomous driving simulation tool compatible with the WSG84 GPS coordinate standard.

7. The system of claim 6, wherein the driving log file and the on-road driving scenario do not have a predefined maximum duration.

8. The system of claim 1, wherein the template is obtained from a database comprising a plurality of predefined templates.

9. The system of claim 8, wherein each of the plurality of predefined templates is one or more comma separated value (CSV) files.

10. The system of claim 1, wherein the desired file format for the ADAS/autonomous driving feature simulation scenario is JavaScript Object Notation (JSON).

11. A simulation and verification method for an advanced driver assistance (ADAS) or autonomous driving feature of a vehicle, the method comprising:

receiving, by a computing device comprising one or more processors and from a controller of the vehicle, a driving log file and map data corresponding to an on-road driving scenario by the vehicle captured by a set of sensors of the vehicle;

overlaying, by the computing device, the driving log file and the map data to generate combined data that localizes a position of the vehicle;

using, by the computing device, the combined data, obtain (i) a whitelist comprising a set of included objects for an ADAS/autonomous driving feature simulation and (ii) a blacklist comprising a set of excluded objects for the ADAS/autonomous driving feature simulation;

obtaining, by the computing device, a template for the ADAS/autonomous driving feature simulation, wherein the template defines a desired file format for an ADAS/autonomous driving feature simulation scenario;

generating, by the computing device, the ADAS/autonomous driving feature simulation scenario in the desired file format using the white and blacklists and the template;

executing, by the computing device, a simulation of the ADAS/autonomous driving feature simulation scenario using a simulation tool that is designed to process the desired file format to obtain a result;

evaluating, by the computing device, the result of the executed simulation of the ADAS/autonomous driving feature simulation scenario;

updating, by the computing device, the ADAS/autonomous driving feature based on the evaluating to obtain a final ADAS/autonomous driving feature;

uploading, by the computing device and to a controller of the vehicle, the final ADAS/autonomous driving feature to the vehicle; and executing, by the controller of the vehicle, the final ADAS/autonomous driving feature during operation of the vehicle.

12. The method of claim 11, further comprising updating, by the computing device, the blacklist when the result of the executed simulation of the ADAS/autonomous driving simulation scenario is not verified by the evaluating.

13. The method of claim 11, wherein the driving log file is based on the World Geodetic System 1984 (WSG84) global positioning satellite (GPS) coordinate standard.

14. The method of claim 13, wherein the driving log file comprises a set of objects including at least one of (i) the vehicle, (ii) another traffic vehicle, (iii) a current route of the vehicle, (iv) a road speed limit, and (iv) a landmark, and respective WSG84 GPS coordinates of each object of the set of objects.

15. The method of claim 13, wherein the driving log file comprises a set of objects including (i) the vehicle, (ii) another traffic vehicle, (iii) a current route of the vehicle, (iv) a road speed limit, and (iv) a landmark, and respective WSG84 GPS coordinates of each object of the set of objects.

16. The method of claim 13, wherein the simulation tool is any virtual ADAS/autonomous driving simulation tool compatible with the WSG84 GPS coordinate standard.

17. The method of claim 16, wherein the driving log file and the on-road driving scenario do not have a predefined maximum duration.

18. The method of claim 11, wherein the template is obtained from a database comprising a plurality of predefined templates.

19. The method of claim 18, wherein each of the plurality of predefined templates is one or more comma separated value (CSV) files.

20. The method of claim 11, wherein the desired file format for the ADAS/autonomous driving feature simulation scenario is JavaScript Object Notation (JSON).

* * * * *